United States Patent [19]

Dennis

[11] Patent Number: 4,710,399
[45] Date of Patent: Dec. 1, 1987

[54] METHOD AND MECHANISM TO DEPOSIT SOLDER PASTE UPON SUBSTRATES

[76] Inventor: Richard K. Dennis, P.O. Box 2039, R.D. #2, Etters, Pa. 17319

[21] Appl. No.: 902,785

[22] Filed: Sep. 2, 1986

[51] Int. Cl.$^4$ ............................................. B05D 5/12
[52] U.S. Cl. .................................... 437/245; 427/96; 118/410; 118/411; 118/412
[58] Field of Search .................... 427/88, 96; 118/411, 118/410, 412

[56] References Cited

U.S. PATENT DOCUMENTS

| | | | |
|---|---|---|---|
| 3,970,222 | 7/1976 | Duffield | 222/420 |
| 4,154,379 | 5/1979 | Schermutzki | 222/420 |
| 4,515,297 | 5/1985 | Schoenthaler | 222/160 |
| 4,569,305 | 2/1986 | Ferri | 118/211 |
| 4,604,633 | 8/1986 | Kimura | 73/293 |
| 4,622,239 | 11/1986 | Schoenthaler | 427/96 |

Primary Examiner—John D. Smith
Assistant Examiner—Vi Duong Dang

[57] ABSTRACT

A method and mechanism to form minute drops of solder paste of uniform size spaced in desired patterns upon substrates of semi-conductor devices by extruding the paste under pressure through similar holes in a die while closely spaced above a substrate and, immediately after contacting the ends of minute columns of the paste with the substrate to adhere the same thereto, instantly raising the die to effect separation of the columns from the adhered ends on the substrates which comprise dots of paste of substantially uniform size which are spaced from each other. The paste is dispensed from a shallow reservoir above the die and defined by a flexible diaphragm positioned in opposition to the die and against which a pressure member operates against the diaphragm and paste contained in the reservoir to effect discharge of the paste under pressure as described above.

20 Claims, 10 Drawing Figures

METHOD AND MECHANISM TO DEPOSIT SOLDER PASTE UPON SUBSTRATES

BACKGROUND OF THE INVENTION

To manufacture semi-conductor devices which include a non-conducting substrate upon which circuitry is printed upon one or both opposite faces thereof and to which leads are to be connected by solder to terminals usually along the edges of said substrate, lead frames arranged in strips of indeterminate length are provided with such leads and heads also are on one end of such leads in parallel rows for connection to said substrate. One example of such strips of lead frames comprise the subject matter of applicant's co-pending application, Ser. No. 648,972, filed Sep. 10, 1984. For purposes of constantly tending to minimize the sizes of such substrates, the industry tends to form and arrange the terminals of the circuits on said substrates in ever closer relationship, thus posing a problem relative to depositing the necessary globules or dots of solder upon the substrate immediately adjacent the heads which are to be connected by solder to said terminal.

At present, and heretofore, where the spacing between the terminals on the substrate permitted the use of tubular dispensers in close relationship to each other, the still closer spacing of the terminals as now desired, substantially eliminates the use of tubular dispensers in view of the wall thicknesses of the same, even in closely arranged relationship. Hence, the industry has now introduced dispensing dies in which holes of minute diameter are provided therein in very closely spaced relationships, and examples of the same are somewhat illustrated in prior U.S. Pat. Nos. 4,295,596 to Doten et al, dated Oct. 20, 1981 and 4,515,297 to Schoenthaler et al, dated May 7, 1985.

The prior art also discloses means for forming small dots of solder and other similar materials, such as those of a viscous nature, and examples of attempted solutions to such discharge problems comprise the subject matter of prior U.S. Pat. Nos. 3,970,222 to Duffield, dated July 20, 1976; 4,030,640 to Citrin et al, dated June 21, 1977; and 4,154,379 to Schermutzki, dated May 15, 1979.

At present, it is common to use manufactured solder paste furnished commercially in tubes of different sizes and in which infinitely small chips of commonly used metal, such as tin for example, are mixed with a suitable carrier to produce a a viscous paste which, hopefully, is of uniform character between different manufactured batches thereof. Unfortunately, this is not always a fact and, hence, problems are presented in delivering such paste in suitable sizes useful in soldering operations relative to very closely spaced terminals of the circuits of substrates of the type to which the present invention pertains, in order that suitable spacing between adjacent terminals and soldered heads will exist in finished products. The present invention is directed to a solution of the problems now existing in the formations of adequate, closely spaced soldered connections between the heads of leads and terminals on the circuits on substrates, details of which are set forth below.

SUMMARY OF THE INVENTION

It is one of the principal objects of the present invention to provide both a method and mechanism to deposit infinitely small globules or drops of solder paste in exceedingly close rows or other arrangements thereof upon the substrate in such manner that there is no electrical contact between adjacent soldered connections on such substrates, this being accomplished by the use of a die in which rows of very closely spaced holes are formed in accordance with a pattern of soldered connections to be made upon a substrate on which printed circuits and terminals are formed and utilizing certain techniques and methods by which minimal size drops of solder are deposited in such separated manner immediately adjacent the area on substrates where soldered connections are desired to be formed.

It is another object of the invention to provide a solder deposit head in conjunction with said die and employ a relatively shallow reservoir which is suitably connected to a source of solder paste under pressure, and by means of a flexible diaphragm mounted in said head in opposition to the die which contains the holes thereby defines the shallow reservoir in such manner that by movement of a squeegee blade in one direction across the opposite surface of the diaphragm from that which defines the reservoir, adequate pressure is developed to discharge viscous material, such as solder paste, through said holes under substantially uniform pressure and thereby form columns of solder paste in a manner that the outer ends thereof contact and adhere to a substrate surface and, when such columns are instantly withdrawn, effect separation of the same from the adhered ends which automatically shape themselves into dots of desired diameter as well as height.

It is a further object of the invention to provide adjustability of the squeegee blade relative to the diaphragm and the resulting body of paste in the reservoir between the diaphragm and die in order that pressure of desired amount may be exerted upon the paste while it is being discharged by movement of the blade across the diaphragm at a desired space between the the active edge of the blade and the holes in the die, thereby forming the aforementioned small columns of paste with extremely small diameter for the aforesaid purposes.

It is still another object of the invention, at the conclusion of one excursion or movement of said blade in one direction across said diaphragm, to elevate said blade vertically away from the diaphragm a minuscule distance incident to the head being elevated to disconnect the columns of paste from the adhered dots thereof on the substrate and thus effect a momentary relaxation of pressure upon the diaphragm and paste in the reservoir, thereby discontinuing active discharge of said columns of paste a brief moment sufficient to facilitate the separation of said columns of paste from the adhered dots thereof applied to the substrate.

One other object of the invention is to provide a solder deposit head with a block which forms the delivery end thereof and in which an opening extends away from one face thereof against which the diaphragm is disposed and said squeegee blade is mounted within said opening and is moved from side to side of the opening while engaging the diaphragm to effect the aforementioned discharge of columns of paste through the holes in the die, and opposite ends of the flexible diaphragm extend upwardly along opposite sides of said block to which side plates are attachably connected to clamp said ends of the diaphragm in operative position with the transverse intermediate portion thereof disposed in opposition to the die plate and thereby defining said reservoir therebetween, and the die plate having a shallow cavity therein to comprise the reservoir and over which the diaphragm extends in spaced relationship to the pattern of discharge holes in the die, at least one of said side plates being provided with a passage communicating at one end with a paste inlet port leading from said source of supply and the other end communicating with said reservoir.

Still another object of the invention pertaining primarily to the method of operation of the mechanism is to effect by power means movement of the operative end of the blade along a path substantially parallel to the inner surface of said die and engaging the diaphragm in a manner to force paste through the holes of the diaphragm in uniform manner, at least to the extent of the pattern of said holes, and then elevate said blade a limited distance from said diaphragm to momentarily relieve pressure on the paste in the reservoir during the instant elevation of the die head to separate the columns of paste from the ends thereof which have adhered to the substrate as aforesaid and then continue movement of said blade in the same direction but at an elevated position to dispose the blade over a bulge normally formed in the reservoir by advancement of the blade as described, and then lower the blade in such extended position to the desired feeding elevation thereof, at which time the head will be lowered in the desired cycle for a return or opposite movement of the blade to effect a successive deposit of dots upon a successive substrate in accordance with the desired cycle of operation of the mechanism, thereby expediting speed of operation of the mechanism, which, preferably, does not exceed one second of time in which a complete pattern of dots of solder are deposited upon and adhered to a substrate.

A still further object of the invention ancillary to the immediate foregoing object is to provide mechanism including individual, cooperating fluid-operated units respectively mounted upon suitable guide means and in timed relationship to effect said aforementioned transverse movement of said blade along the path thereof above the diaphragm and also move said blade perpendicularly a limited distance away from said diaphragm adjacent the end of said transverse movement and controlled by suitable commonplace valves of known type and operation in accordance with a fixed cycle which is adjustable.

One further object of the invention ancillary to the immediate foregoing object is to connect the blade to one of said fluid-operated cylinder units and support said units upon a shaft vertically adjustable by vernier-type means capable of adjusting the operative end of the blade perpendicularly with respect to the diaphragm to effect a desired degree of pressure upon the solder paste to form uniform discharging columns thereof and result in deposited and adhered dots of said paste upon a substrate.

Details of the foregoing objects and of the invention are set forth in the following specification and illustrated in the accompanying drawings comprising a part thereof.

DETAILED DESCRIPTION OF THE PREFERRED EMBODIMENT OF THE INVENTION

Figure 1:
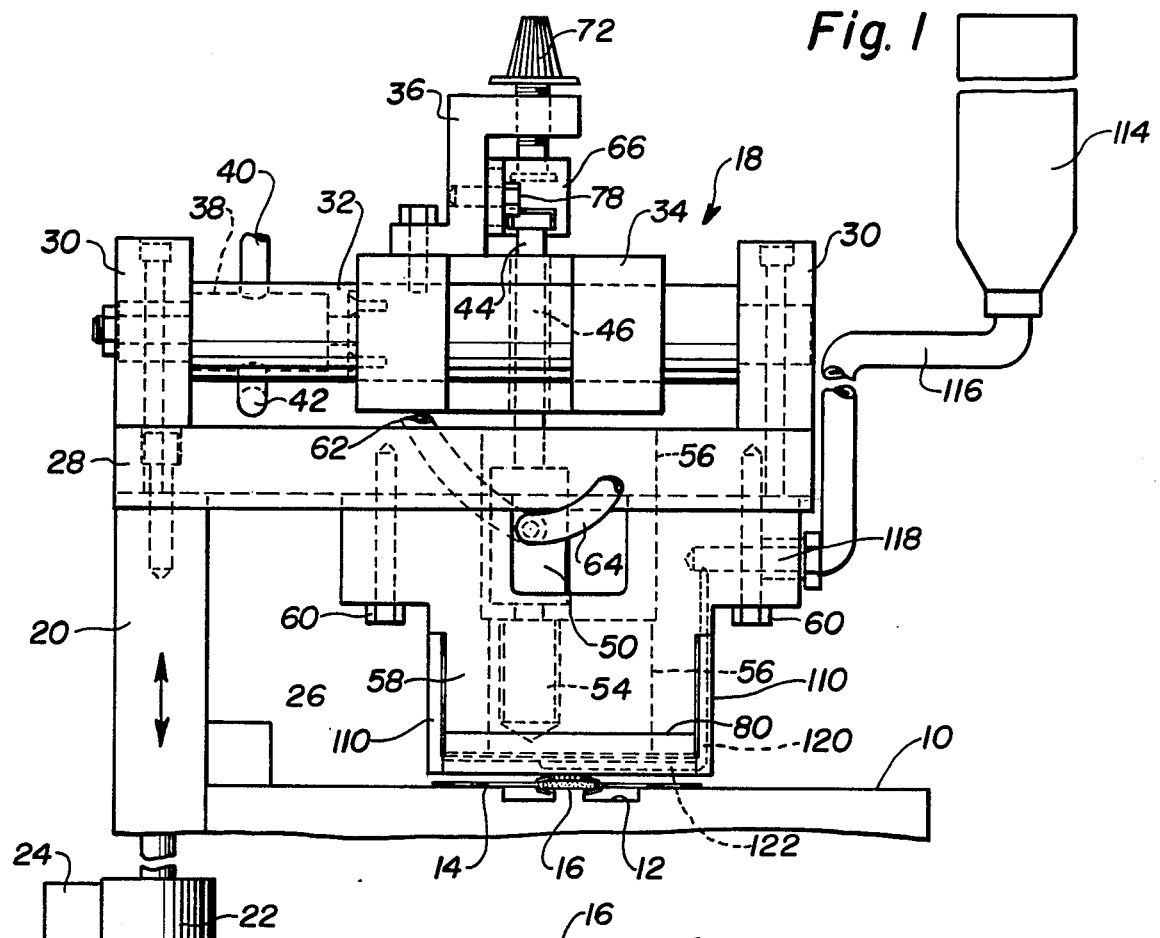
FIG. 1 is a side elevation, partly fragmentary, illustrating a solder paste depositing mechanism embodying the present invention and illustrating the discharge means thereof adjacent a substrate positioned for reception of solder therefrom.
Figure 2:
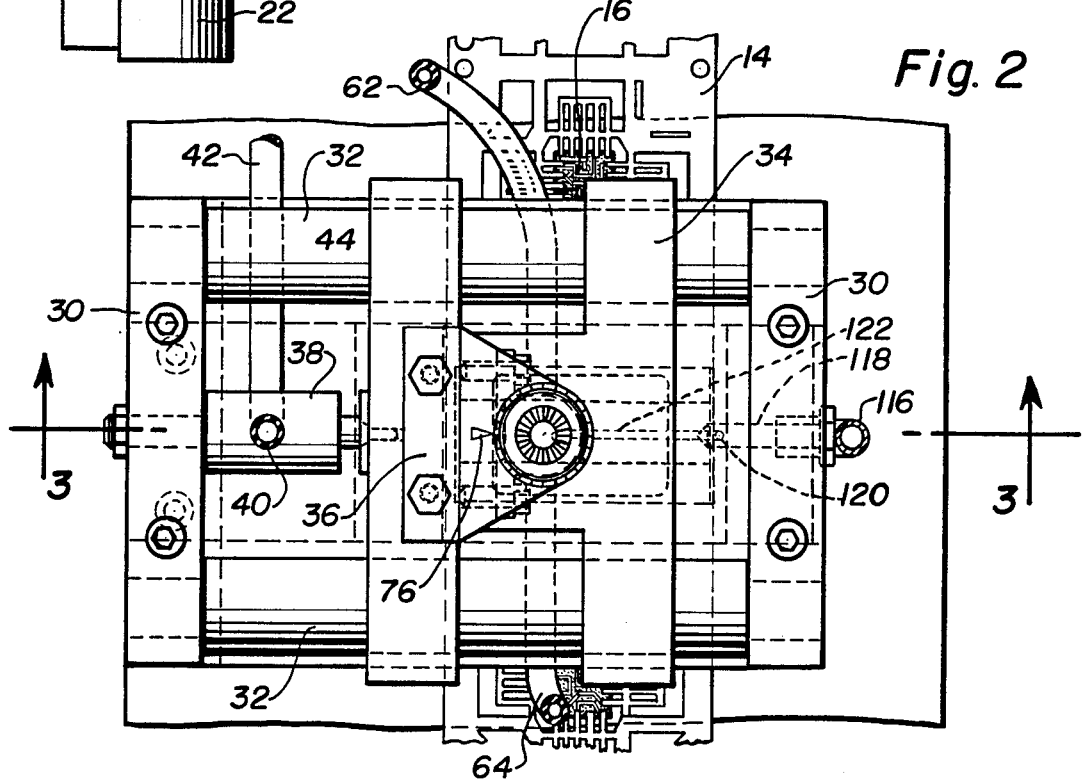
FIG. 2 is a plan view of the mechanism shown in FIG. 1, opposite ends thereof being fragmentary and also illustrating a fragmentary portion of a strip of lead frames operatively positioned in the mechanism.
Figure 3:
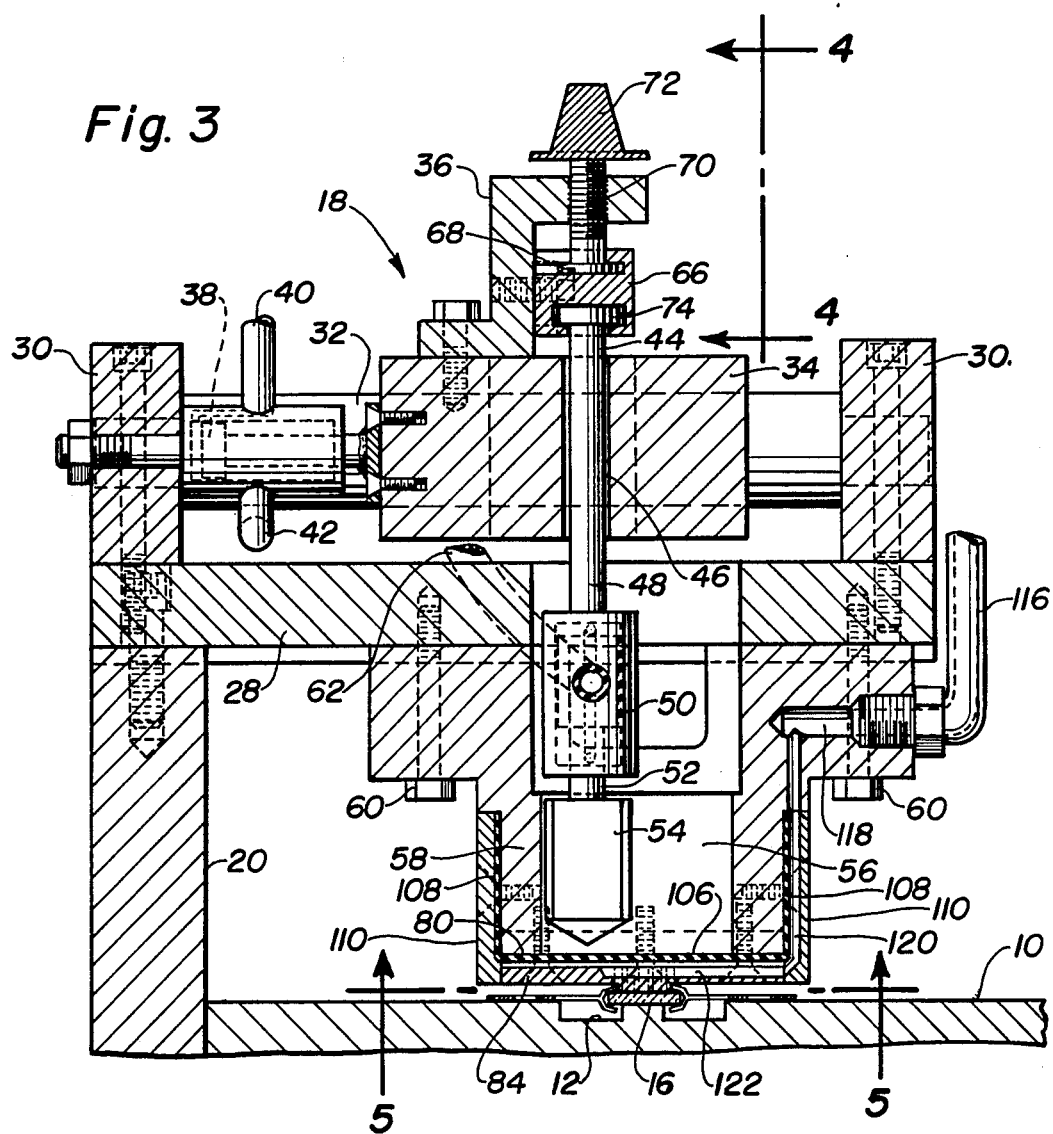
FIG. 3 is a vertical sectional view taken substantially through the center of the assembly of mechanism, as seen on the line 3-3 of FIG. 2, and prepared on a larger scale than shown in FIG. 1.

Referring to FIGS. 1-3, there in illustrated therein the solder paste discharge mechanism, including a frame, not shown in its entirety, which includes the fragmentarily illustrated bed portion 10, which is fixed relative to supporting mechanism and includes a guide channel 12, along which a strip of connected lead frames 14 are moved successively in a manner to accurately position individual lead frames at a depositing position with respect to the channel 12 in order that the mechanism may discharge uniform dots of solder paste in a desired pattern upon substrates 16 supported respectively by the lead frames upon which leads and heads are provided, as shown fragmentarily, especially in FIG. 2.

The principal item of the mechanism with which the present invention is concerned comprises a head 18 which is secured to a vertically-movable member 20, such movement being effected by appropriate mechanism of a known type, such as fluid-operated cylinder unit 22, which is mounted suitably upon the frame upon which the bed portion 10 is a part, the cylinder unit 22 also including appropriate suitable and conventional control mechanism 24 to effect raising and lowering of the head 18 with respect to the strip of lead frames 14 within controlled limit, such movement, for example, specifically in the present instance, being in the range of approximately ⅛ inch, but such dimension is not to be considered restricted. Also, cylinder unit 22 is of such a nature as to move the head 18 perpendicularly in opposite directions. The movement of the head 18 toward the bed portion 10 is adapted to be restricted by any suitable means, such as a conventional stop 26 affixed, adjustably or otherwise, to the vertically movable member 20, for purposes to be described hereinafter.

The head 18 includes a horizontal plate 28 from which fixed uprights 30 extend for purposes of supporting a preferably parallel pair of guide rods 32, the ends of which are fixed to the uprights 30. Said guide rods slidably support an H-shaped frame 34 upon which a bracket 36 is mounted fixedly. A preferably fluid-operated cylinder and shaft unit 38 is fixed at one end to the left-hand upright 30, as viewed in FIG. 1, and appropriate fluid delivery and return conduits 40 and 42 are appropriately connected respectively to a source of fluid under pressure and the shaft 44 of the unit is connected to one end of the H-shaped frame 34 to effect movement of the same in opposite directions for purposes described hereinafter.

Extending through the central portion of the H-shaped frame 34 is a hole 46 through which a shaft 48 extends in vertical relationship to the bed portion 10 of the frame and affixed to the lower end of shaft 48 is a cylinder 50 of a second fluid-operated unit from one end of which a shaft 52 extends and is connected to the upper end of a squeegee blade 54, which is positioned in an opening 56 formed in a block 58, the upper end of which is connected by bolts 60 to the under side of horizontal plate 28.

Cylinder 50 controls the vertical movement of blade 54 for purposes to be described. Appropriate fluid-conducting conduits 62 and 64, see FIG. 2, are connected to the cylinder and extend to a conventional type source of supply and control means, not shown, of a type adapted to raise and lower the blade 58 in accordance with a desired cycle of operation. Especially to control the descending movement of the blade 54, the bracket 36 supports a connecting member 66, which has suitable recesses respectively to receive a circular head 68 on the lower end of threaded rod 70, the upper end of which has a vernier type knob 72 affixed thereto, the rod 70 being threaded within the upper portion of bracket 36, and the connecting member 66 also has a recess to receive another circular head 74 that is fixed to the upper end of shaft 44. It, thus, will be seen that as the knob 72 is rotated with respect to a fixed index point 76, see FIG. 2, on bracket 36, the rod 44 and correspondingly, the cylinder 50 will be raised or lowered depending upon the direction of rotation of the knob 72 and the threaded rod 70.

Figure 4:
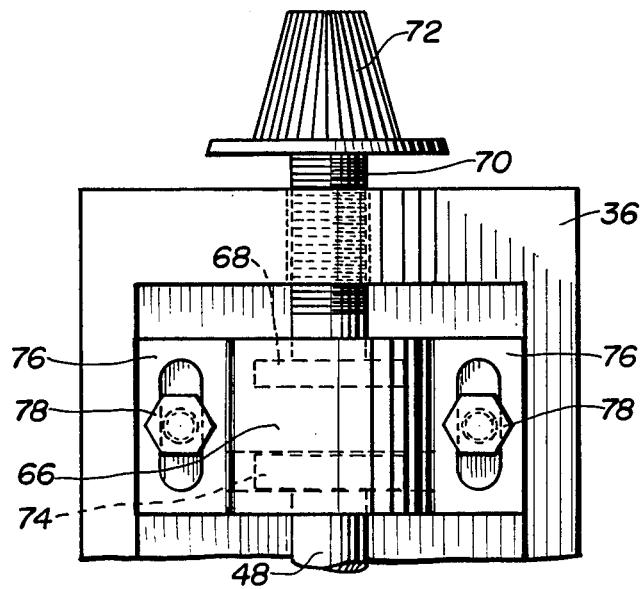
FIG. 4 is an enlarged fragmentary detail of adjusting mechanism shown in the upper portion of FIG. 3 for purposes of adjusting the vertical position of a pressure-forming member in the mechanism.

Referring to FIG. 4, and also FIG. 1, it will be seen that connecting member 66 has slotted flanges 76 extending in opposite directions and having vertical slots therein through which clamping bolts 78 are disposed, whereby when a desired adjustable position of cylinder 50 has been arrived at, the bolts 78 are tightened in order to maintain such vertical position of said cylinder.

Figure 6:
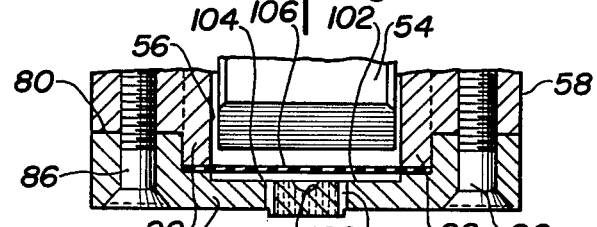
FIG. 6 is a vertical sectional view of a detail of the mechanism shown in FIG. 5, as seen on the line 6—6 of FIG. 5, but illustrated in the same relationship as shown in FIGS. 1 and 3 as distinguished from the bottom plan view of FIG. 5.

The block 58 is a very important part of the present invention, together with the opening 56 therein. As seen in FIG. 1, the opening 56 also extends upwardly through the horizontal plate 28 for purposes of accommodating the cylinder 50 therein in order that the same may be moved reversely in opposite directions toward and from the opposite sides of the opening 56 incident to moving the blade 54 sequentially in opposite horizontal directions, as viewed in FIGS. 1 and 3, and vertical movements of the blade 54 are effected by the cylinder unit 50. The block 58 has a lower horizontal face 80 through which the opening 56 extends, see FIGS. 1 and 6. As shown in FIG. 6 especially, inner portions of the lower horizontal face 80 have short depending parallel ribs 82, and a die 84 has an upper surface which is complementary to the lower face 80 of block 58. As seen in FIG. 6, the die is secured to block 58 by bolts 86.

Figure 5:
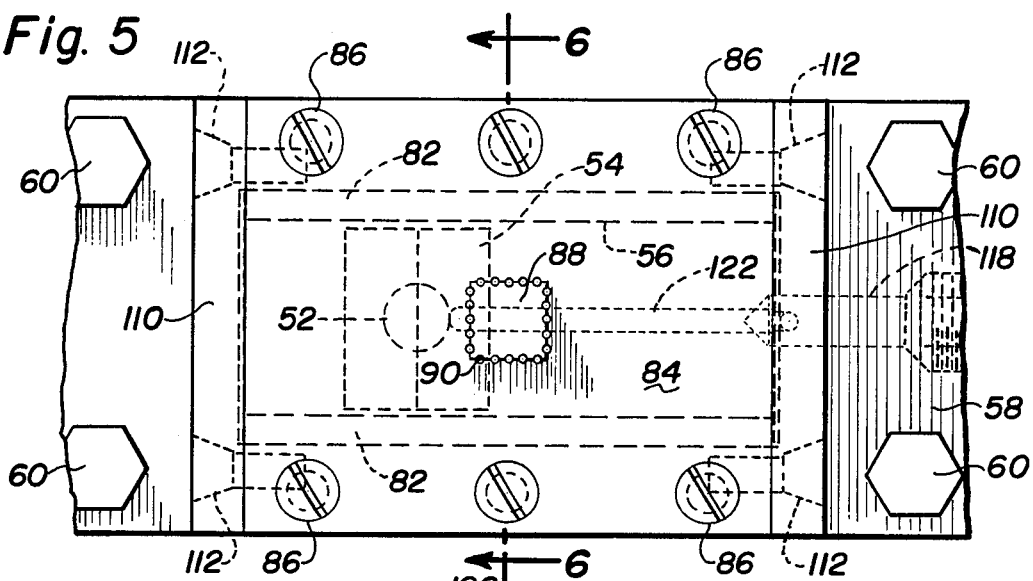
FIG. 5 is an enlarged fragmentary detail plan view of the lower surface of the mechanism illustrated in FIGS. 1 and 3, as seen on the line 5—5 of FIG. 3.

The primary feature of the die 84 comprises a pattern 88 of relatively short discharge holes 90, the specific pattern 88 thereof shown in FIG. 5 being square but such illustration is not to be considered restrictive. Also, as best viewed in FIGS. 7 and 8, the portion 92 of the die which is within the pattern of the holes 90 projects a limited distance of several thousandths of an inch below the surface of the peripheral portion of the die 84 for purposes of permitting said portion of the die to extend more closely to the desired surfaces of the substrate 16 than the peripheral surface portions 94 of the die for reasons best illustrated in FIGS. 9 and 10, to which attention is now directed.

Figure 9:
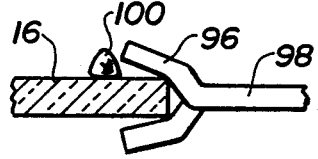
FIGS. 9 and 10 show solder shapes "before" and "after" heating.
Figure 10:
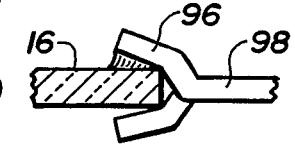

In FIGS. 9 and 10, a preferred shape of head 96 on one end of each lead 98 in the lead frames 14 extends a certain distance above and below the opposite surfaces of the substrate 16 and, by the foregoing arrangement embodying the portion 92 of the die as described above, the outlet ends of the holes 90 can approach the surfaces of the substrates 16 more closely than the peripheral surface portion 94 of the die 84, but under no circumstances is said portion 92 moved into contact with the substrate and, in accordance with the invention, the same is not to approach the surfaces of the substrate more closely than 0.002 inches in order to prevent squashing dots 100 of solder, figuratively illustrated in exemplary manner only in FIG. 6.

The interface of the die 84, as best shown in FIG. 6, perferably has a shallow recess 102 formed therein, which defines one surface of a solder reservoir 104, which, in area, is at least commensurate with the shape and pattern of holes 90 in the die plate 84. A flexible diaphragm 106, which is substantially parallel to the horizontal surface of recess 102, defines an opposite side of the reservoir 104 and all edges of the diaphragm are sealed relative to the block 58 by opposite edges thereof extending between the ribs 82 and the opposite complementary portions of the die 84, as best shown in FIG. 6, while opposite ends 108 of the diaphragm extend upwardly along opposite sides of the block 58, as clearly shown in FIG. 3, and clamping side plates 110 engage the outer surfaces of said ends 108 of the diaphragm and firmly clamp the same against said sides of the block 58 by means of screws 112, see FIG. 5. Thus, it will be seen that all edges of the diaphragm are firmly clamped with respect to block 58, and the only exit of paste from the reservoir 104 is through the holes 92.

Referring to FIG. 1, it will be seen that a supply of solder paste, preferably of desired viscosity and quantity, is obtained from commercial sources in a tube or other form of container 114, shown in exemplary foreshortened manner in FIG. 1, and an appropriate conduit 116 extends between a suitable mounting for the container 114 and an inlet 118 in block 58, illustrated in phantom in FIG. 1. The right-hand side plate 110, as viewed in FIG. 1, also is provided with an internal channel 120, which, at one end, communicates with a horizontal groove or passage 122, which is formed in the inner surface of die 84, as clearly shown in FIGS. 1–3, 5 and 6. Under preferred conditions, the supply of solder delivered from container 114 is maintained under a suitable pressure, such as between 25 and 30 p.s.i., but it is to be understood that this range may be varied from said limits. By such arrangement, there is a constant supply of solder to reservoir 104 and the operation of the blade 54 relative to diaphragm 106, for purposes of providing discharge of paste through holes 90 in substantially even manner, is as follows:

Depending upon the desired speed of operation of the mechanism and also the size of desired dots of solder 100 to be discharged upon a surface of the substrate 16, the position of cylinder 50 is adjusted to a position at which particularly the lowest movement of the lower edge of the blade is to be operated with respect to diaphragm 106. This is accomplished by manipulation of knob 72, after loosening clamping bolts 78 and when the desired position is reached, depending upon trial operation of the mechanism, for example, the bolts 78 then are tightened. Lateral or horizontal movement of the blade 54 is achieved by operation of cylinder unit 38, as programmed by control means, not shown. In cooperation therewith, cylinder 50 is operated so as to initially lower the blade 54 in the direction of arrow 124 to move the blade from the full line illustration thereof to that of the phantom illustration, after which, cylinder 38 effects movement of the blade 54 in the direction of arrow 126 until it at least reaches the lower phantom position of the blade 54 immediately adjacent the point of arrow 126. Then the control means cycles the lower end of the blade from the lower phantom position to the upper phantom position adjacent arrow 128, after which the blade is moved in the direction of arrow 130 to the right-hand phantom position thereof and, in so doing, the end of the blade is moved from contact with diaphragm 106 in order that it may move to the right past a bulge 132 of the solder paste, which bulge is caused to form by virtue of the horizontal movement of the blade in accordance with arrow 126. Such movement effects a complete discharge of small columns of paste through holes 90 into engagement of the outer ends thereof for contact therewith and adherence to a substrate and, immediately upon said adherence occurring to the substrate, cylinder unit 22 instantly functions to raise the entire head 58 to separate the extended but relatively short columns of paste from the adhered dots 100 thereof which have engaged the substrate 16, as shown in FIG. 6, in exemplary manner.

Figure 7:
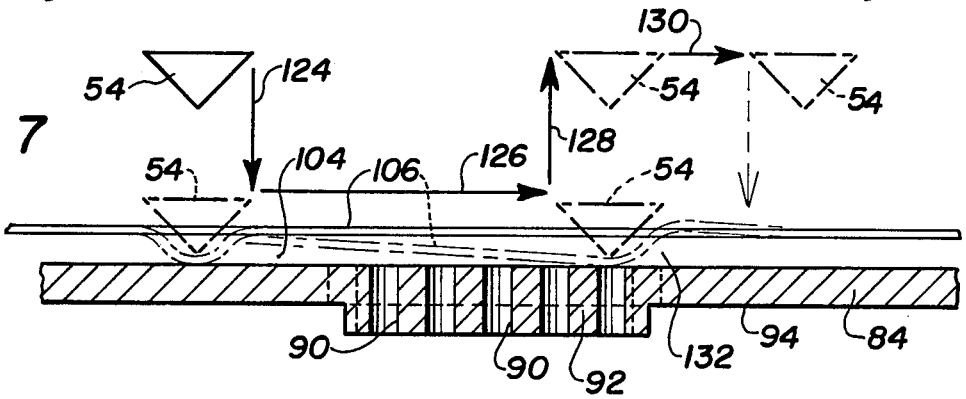
FIGS. 7 and 8 are schematic views showing respectively the alternate, relatively reverse operations of the squeegee blade of the pressure-producing mechanism which operates to discharge solder paste through the holes of the die on the discharging head, the scale of these figures being still further increased over those utilized in the preceding figures.
Figure 8:
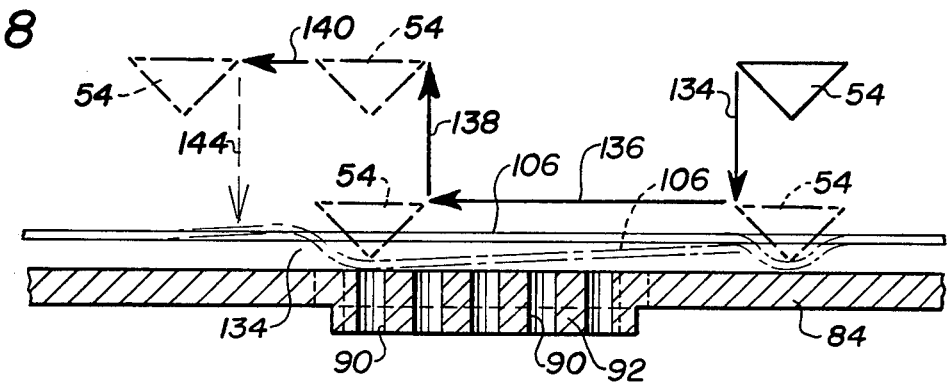

In accordance with the preferred cycle, and referring to FIG. 8, the full line illustration of the lower end of blade 54 adjacent the right-hand end of the figure corresponds to the elevated phantom position thereof, shown in FIG. 7, and from which the lower end of the blade 54 quickly is moved in descent according to arrow 134, after which the lower end of the blade 54 is moved to the left in accordance with arrow 136, for purposes of effecting another discharge of short columns of paste through holes 90 onto a subsequent substrate in the lead frame 14 and, when the lower end of said blade 54 reaches the lower left-hand position thereof with respect to diaphragm 106, it is raised in the direction of arrow 138 to the exemplary phantom position shown above the lower phantom position, followed by further movement of the elevated lower end of the blade 54 in the direction of the arrow 140 to cause said blade to move past the bulge 134 of solder paste and subsequently be lowered from the left-hand most phantom position thereof in the direction of arrow 144 so as to be in position to start a subsequent discharge operation of the blade with respect to the diaphragm 106, and thus, effect dots of paste to be deposited upon a subsequent substrate 16.

From specific results of operation of mechanism of the type illustrated herein and described above, it has been found to be possible to operate successive discharges of dots 100 of solder paste upon a surface of substrate 16 at the rate of approximately 3500 per hour, or a single deposit each second of time. One specific diameter of the holes 90 is 0.021 inches and that has been found to be satisfactory when operating with commercial type solder paste of the type conventionally employed relative to soldering heads of leads to the surface of substrates. Without restriction thereto, operation of such machine has been successful to produce dots of solder approximately 0.018 inches in diameter and 0.006 inches high, which are highly adequate to be melted and disposed between, for example, the upper head 96 of a lead 98, as shown in FIG. 10, when the substrate with the dots 100 of solder adhered thereto are passed through heating means, such as a conventional re-flow furnace. Further, by being capable of depositing dots of solder having the aforementioned dimension upon the substrate, it is possible to discharge said dots on substantially 0.050 inches between centers of successive dots of paste.

For purposes of separating the extruded columns of paste as they pass through the holes 90 and the outer ends engage and adhere to a surface of a substrate 16, it has been found, for example, that elevation of the head 18 to a distance of approximately ⅛ inch, as caused by operation of cylinder 22, has been found to be fully adequate to effect the desired separation of the columns of solder from the deposited dots thereof and following which a substrate which has received such dots of solder immediately is advanced stepwise to dispose a succeeding substrate beneath the die 84 and in position to have a pattern of dots positioned upon and adhere to said succeeding substrate.

From the foregoing, it will be seen that the present invention provides a method and mechanism by which dots of solder paste of smaller dimensions than those previously formed by prior devices and arranged on shorter distances between centers thereof than heretofore could be accomplished, and especially by mechanisms using tubular-type delivery nozzles or the like. Further, separation of the columns of solder from the adhered outer ends thereof on the substrate in the form of dots is effective in a highly satisfactory manner by instant and momentary release of pressure upon the paste in the reservoir as a result of limited elevation of the blade from its lower, operative position with respect to the diaphragm, and while constant delivery pressure of paste from a source thereof to the reservoir can continue at an even rate, such as the order of between 25 and 30 p.s.i. or otherwise, as distinguished from successive variations in pressure upon the supply of paste in a reservoir as is commonly undertaken by devices currently and previously used.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

I claim:

1. A method to deposit viscous solder paste upon a substrate of a semi-conductor device comprising the steps of:
   a. positioning a substrate at a predetermined position to receive dots of paste in a desired pattern,
   b. connecting a solder deposit head to a source of said paste maintained under predetermined pressure,
   c. reciprocating said head between an elevated starting position spaced above said substrate and a depositing position immediately adjacent the substrate but spaced a limited distance thereabove, d. exerting pressure upon paste within said head to effect discharge of paste through a die having a desired pattern of holes therein while said head is in said depositing position and similar columns of paste are discharging through said holes toward said substrate by said exerted pressure, e. instantly effecting elevation of said head from said substrate when the discharging ends of said columns have engaged said substrate and adhered thereto and thereby cause separation of said columns from the adhered ends thereof on said substrate which comprise similar sized dots of said solder thereon, and f. momentarily and immediately discontinuing said pressure within said head upon initiating elevation of said head as aforesaid and thereby very briefly discontinue discharge movement of paste through said holes in said die and thereby enhance said separation of said dots from said columns of paste by said elevation of said head, g. followed by removing said first mentioned substrate from its receiving position and advancing a succeeding substrate to said receiving position and repeating the above-described sequence of operations after restoring pressure to the paste in said head immediately following each discontinuance of pressure thereon.

2. The method according to claim 1 in which said solder deposit head includes a reservoir communicating with said pattern of holes and a flexible diaphragm spaced in opposition to said holes, and including the further step of moving a squeegee blade type pressure member against said diaphragm to comprise said exertion of pressure and thereby effect discharge of paste from said reservoir through said holes as aforesaid.

3. The method according to claim 2 including the further steps of effecting one discharge movement of columns of solder from said die while the blade is moving in one direction as aforesaid and then raising said head from said depositing position to effect separation of columns of paste from the deposited dots of solder, and then lowering the head and moving said blade in reverse direction to effect a subsequent deposit of paste upon a subsequent substrate.

4. The method according to claim 4 including the further step immediately following each deposit of solder of raising said blade a limited distance from pressure position upon said diaphragm to relieve said pressure and thereby momentarily discontinue discharge while continuing to move the blade instantly a limited distance past the pattern of holes to cause the blade to move over a bulge of solder beneath the diaphragm resulting from the preceding discharge, and then lower the blade to the pressure position thereof upon said diaphragm prior to effecting reverse movement of the blade to effect the succeeding deposit of solder upon a succeeding substrate.

5. The method according to claim 4 including the further step of utilizing fluid-operated cylinders to effect movement of said blade and head as aforesaid and effecting an operating cycle of said blade and head of no more than one second of time.

6. The method according to claim 1 including the further step of restricting said head against movement of the outer face of said head into direct contact with said substrates.

7. The method according to claim 6 in which said head includes a die in which said pattern of holes are formed and maintaining the outermost face of said die at least substantially 0.002 inches from said substrates during discharge of solder onto the same.

8. Mechanism to form and deposit minute drops of solder paste of substantially uniform size upon precise locations on a substrate of a semi-conductor device comprising in combination:

a. support and guide means precisely to position similar substrates of semi-conductor devices sequentially at a receiving position, b. a deposit head including a die plate provided with a pattern of discharge holes formed therein in closely spaced positions and commensurate in diameter to the size of drops of paste to be applied to said substrate, c. a reservoir in said head above said die plate, d. a flexible diaphragm overlying said die plate in said reservoir with one surface in opposition to said die plate, e. a pressure member movable in wiping manner along the opposite surface of said diaphragm to exert pressure thereon, f. a source of supply of viscous solder paste in communication with said reservoir at substantially constant pressure, g. power means connected to said pressure member and operable to reciprocate the same in at least one direction to force discharge of said solder paste substantially uniformly through said pattern of holes onto a substrate of a semi-conductor device when positioned below and indexed relative to the pattern of holes in said deposit head, and h. means operable to withdraw said deposit head a limited distance away from said semi-conductor device immediately after making contacting adherence of the ends of extruded columns of solder paste with said substrate and thereby effect separation of the columns from the drops of paste thus deposited upon said substrate.

9. The mechanism according to claim 8 further including a frame, said support and guide means for said semi-conductor device being fixedly supported by said frame, means on said frame supporting said deposit head for movement toward and from said support and guide means, further guide means on said head supporting said pressure member for movement along a path parallel to and spaced above said diaphragm, and said power means supported by said frame and connected to said pressure member and operable to reciprocate the same relative to said diaphragm as aforesaid.

10. The mechanism according to claim 9 in which said pressure member is a squeegee blade, and said mechansim further including a mount for said blade comprising a shaft perpendicular to said die plate and diaphragm and supported by said further guide means for movement parallel to said die plate by said power means.

11. The mechanism according to claim 10 further including axially adjustable means connected to said shaft and operable to vary the position of said blade perpendicularly relative to said diaphragm.

12. The mechanism according to claim 11 further including additional power means connected to said shaft and including an operating member connected to said blade and operable to vary the position of said blade perpendicularly relative to said diaphragm during a cycle of operation of said blade relative to said diaphragm incident to an adjusted position of the blade relative thereto.

13. The mechanism according to claim 12 in which said adjustment means is a vernier-type having a dial operable relative to a fixed index point for fine adjustment.

14. The mechanism according to claim 12 in which said power means and additional power means respectively comprise double-acting fluid-operated cylinder and shaft units each connected independently to sources of fluid power and programmed to effect a cycle of operation to effect successive discharges of columns of paste as aforesaid relative to substrates of semiconductor devices.

15. The mechanism according to claim 8 in which said deposit head comprises a block having a substantially rectangular opening therein extending inward from one face and said pressure member comprises a blade movable from side to side in said opening and substantially as wide as one transverse dimension of said opening, said diaphragm extending across one end of said opening and secured at its ends against said one face of said block, said die plate extending across said diaphragm and engaging at least opposite ends thereof, and means securing said die plate against said ends of said diaphragm to clamp both of the same against said block to define a shallow reservoir adjacent said holes in said die plate.

16. The mechanism according to claim 15 in which the surface of the die plate adjacent said diaphragm has a shallow recess therein at least commensurate in area and shape with the pattern of holes in said die plate.

17. The mechanism according to claim 16 in which said block has opposite sides extending away from said one face of said block, opposite end portions of said diaphragm extending upward from said face of said block, and side plates secured detachably to said sides of said block and overlying respectively said ends of said diaphragm to clamp the same against said sides of said block.

18. The mechanism according to claim 17 in which said block has means to receive paste from a source thereof, one of said side plates having a passage therein communicating respectively at its opposite ends with said paste-receiving means of said block and an inlet passage in said die communicating with said shallow recess in said die plate to provide for delivery of paste to said reservoir.

19. The mechanism according to claim 8 in which said die plate has a portion on the outermost face thereof bounded substantially by a rectangular pattern of holes therein and projecting a limited distance beyond the peripheral portions of said outermost face defined by said pattern of holes and operable to extend closer to the face of a substrate upon which drops of paste are to be applied than said peripheral portions of said die plate, thereby to accommodate heads of leads of a lead frame which are to be connected by solder to a circuit upon said substrate.

20. The mechanism according to claim 19 further including stop means operable between said support and guide means for said substrates and the die plate of said deposit head to limit the movement of the outer face of said projecting portion of said die plate toward a substrate and provide a space remaining therebetween when said deposit head has been moved to its fullest extent toward said substrate, whereby squashing of deposits of paste applied thereto is prevented and desired shapes are obtained.

* * * * *